United States Patent
Muraki

(10) Patent No.: US 7,492,289 B2
(45) Date of Patent: Feb. 17, 2009

(54) SIGNAL PROCESSING METHOD AND DEVICE

(75) Inventor: Yasuyuki Muraki, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 11/687,207

(22) Filed: Mar. 16, 2007

(65) Prior Publication Data
US 2007/0216550 A1 Sep. 20, 2007

(30) Foreign Application Priority Data
Mar. 20, 2006 (JP) ............... 2006-077007

(51) Int. Cl.
*H03M 7/00* (2006.01)
(52) U.S. Cl. ............... 341/61; 341/143; 708/313
(58) Field of Classification Search ............... 341/143, 341/155, 61; 708/300, 313
See application file for complete search history.

(56) References Cited

U.S. PATENT DOCUMENTS

| | | | | |
|---|---|---|---|---|
| 5,315,699 A | * | 5/1994 | Imai et al. ............... | 345/502 |
| 5,923,273 A | * | 7/1999 | Pastorello ............... | 341/77 |
| 6,260,053 B1 | * | 7/2001 | Maulik et al. ............... | 708/313 |
| 6,470,365 B1 | * | 10/2002 | Rahman et al. ............ | 708/313 |
| 6,693,576 B2 | * | 2/2004 | Azinger ............... | 341/155 |
| 7,039,627 B1 | * | 5/2006 | Modelski et al. ............... | 707/2 |

FOREIGN PATENT DOCUMENTS

JP 09-081542 A 3/1997

* cited by examiner

*Primary Examiner*—Peguy JeanPierre
(74) *Attorney, Agent, or Firm*—Rossi, Kimms & McDowell, LLP

(57) ABSTRACT

Periodically sampled digital data (e.g., digital audio data) are once stored in a work RAM and are then subjected to signal processing such as arithmetic operations using coefficients. A primary accumulator register stores results of arithmetic operations. A secondary accumulator register is specialized in handling a relatively high processing load (e.g., down-sampling) having a plurality of steps, which are distributed and appropriately assigned to a plurality of periods in response to output timings. In order to execute other processing in each period, intermediate results of arithmetic operations regarding the relatively high processing load are temporarily stored in the secondary accumulator register. The number of steps assigned to each period is appropriately changed in response to interruption of the other processing, whereas the relatively high processing load is given a first priority in comparison with the other processing.

12 Claims, 5 Drawing Sheets

SIGNAL PROCESSING METHOD AND DEVICE

BACKGROUND OF THE INVENTION

1. Field of the Invention

The present invention relates to signal processing methods and signal processing devices, which perform signal processing on digital signals such as periodically sampled data representing musical tone signals, video signals, and the like.

This application claims priority on Japanese Patent Application No. 2006-77007, the content of which is incorporated herein by reference.

2. Description of the Related Art

Conventionally, various types of signal processing have been developed with respect to musical tone signals. For example, down-sampling is performed with respect to digital musical tone signals, which were already subjected to sampling with the sampling frequency fs of 485 kHz. Examples of down-sampling are described below.

(1) In the case of down-sampling in which the sampling frequency is reduced from 48 kHz to 24 kHz, fifty steps of operations are necessary for the low-pass filter (LPF) processing (which is needed for the down-sampling), wherein the output is produced once per 2 fs (where fs=48 kHz).

(2) In the case of down-sampling in which the sampling frequency is reduced from 48 kHz to 8 kHz, two hundred steps of operations are necessary for the low-pass filter processing, wherein the output is produced once per 6 fs (where fs=48 kHz).

The reason the number of steps of operations adapted to the low-pass filter processing changes in response to the down-sampling frequency is that the cutoff frequency must decrease as frequencies of signals become low.

The aforementioned processing can be realized by use of a digital signal processor (DSP) in accordance with the following methods.

A first method is that the amount of data processing needed for the down-sampling performed per each fs is represented by the maximum number of steps of operations. When the maximum number of operations is set to two hundred, 200 steps of operations are not performed in a distributed manner per 2 fs but are performed in a concentrated manner per 1 fs. FIG. 5 diagrammatically shows a time-related flow chart in accordance with this method, wherein the amount of data processing performed per each fs is set to 250 steps, and "processing A" is performed once per each fs. For example, the processing A corresponds to the audio effect processing. As the down-sampling, 200 steps of operations are performed once per 6 fs.

At the present time (which is denoted as "PRESENT" in FIG. 5), 200 steps are secured for the down-sampling, which forms a relatively high processing load so that the processing capacity per each fs does not allow other processing to be performed within the range between 1 fs and 5 fs. This method is advantageous in that it does not need complex processing such as distributed processing, whereas it needs 200 steps per each fs. This reduces the number of steps assigned to other processing per each fs.

A second method is to distribute the number of steps of processing in response to the output timing and is taught in Japanese Unexamined Patent Application Publication No. H09-81542. Suppose that 200 steps of operations adapted to the down-sampling, in which the sampling frequency is reduced from 48 kHz to 8 kHz, are performed so as to produce the output once with 6 fs. In this case, approximately 33 steps are performed per each fs. This method needs intermediate results of operations, which are once stored in an accumulator, to be evacuated to a memory when they are changed with results of other processing. This needs the additional number of steps for realizing the evacuation of data from the accumulator to the memory, and this needs a specific path in the hardware.

FIG. 4 is a block diagram showing the configuration of a conventionally-known digital signal processor, i.e., a DSP 30. The DSP 30 includes an input selector 300, a work RAM 301, a program RAM 302, a multiplier 303, a coefficient RAM 304, an adder/subtracter 305, a selector 306, and a register 307.

In accordance with instructions read from the program RAM 302, digital data (such as digital audio data representing musical tones, speech, etc.) are input into the work RAM 301 via the input selector 300, wherein they are written into an area designated by a prescribed address in the work RAM 301. Then, the digital data are read from the work RAM 301 and are supplied to the multiplier 303. In addition, coefficients used for prescribed processing are read from the coefficient RAM 304 and are supplied to the multiplier 303. The multiplier 303 performs multiplication on the digital data read from the work RAM 301 and the coefficients read from the coefficient RAM 304, so that the multiplication result is supplied to an input terminal X of the adder/subtracter 305. At the initial state, the adder/subtracter 305 does not have values to be added to or subtracted from the multiplication result of the multiplier 303; hence, the multiplication result is directly output from the adder/subtracter 305 and is then supplied to the register 307 via the selector 306. The output of the register 307 is output to an external circuit (not shown) and is also returned to an input terminal Y of the adder/subtracter 305.

Thereafter, next digital data are written into the work RAM 301 via the input selector 300, so that they are read from the work RAM 301 at the prescribed timing and are then supplied to the multiplier 303. In addition, coefficients are read from the coefficient RAM 304. The multiplier 303 performs multiplication on the next digital data read from the work RAM 301 and the coefficients read from the coefficient RAM 304, so that the multiplication result is supplied to the input terminal X of the adder/subtracter 305.

In accordance with an instruction given from the program RAM 302, the adder/subtracter 305 performs an arithmetic operation (corresponding to either addition or subtraction) on the multiplication result of the multiplier 303 and the output of the register 307, so that the arithmetic operation result is supplied to the register 307 via the selector 306. The arithmetic operation result is output to the external circuit (not shown) and is also supplied to the input terminal Y of the adder/subtracter 305.

As described above, a series of arithmetic operations (i.e., multiplication, addition, and subtraction) are sequentially performed every time digital data are input into the input selector 300, thus executing various types of processing such as down-sampling.

The DSP 30 has a single accumulator register (i.e., the register 307); hence, in order to perform plural processings in a time-division manner, it is necessary to evacuate the data of the accumulator register to the memory (i.e., the work RAM 301) every time when down-sampling is completed in each fs; then, it is necessary to return the evacuated data to the accumulator register.

The first method, in which periodically sampled data are processed in such a way that a high processing load is collectively executed in units of periods (each corresponding to fs), is advantageous in that it does not need complex processing such as distributed processing. However, the first method is troublesome because it requires a relatively large number of steps for executing a high processing load in units of periods; and this reduces the number of steps assigned to other processing.

The second method, in which steps are distributed in units of periods in response to output timings, is troublesome because it evacuates intermediate results once stored in the accumulator to the memory every time they are changed with other processing. This needs a considerable number of steps for realizing evacuation of data as well as a specific path in the hardware.

SUMMARY OF THE INVENTION

It is an object of the present invention to provide a signal processing method and a signal processing device, in which periodically sampled data are processed in such a way that high processing loads are distributed or averaged in units of periods and which does not need evacuation of data of an accumulator to a memory.

In a signal processing method for processing digital data, which are produced by way of periodical sampling in units of periods, a plurality of steps having a relatively high processing load (e.g., down-sampling) are distributed and assigned to a plurality of periods in response to output timings, so that they are subjected to signal processing in units of periods, wherein intermediate results of the signal processing are temporarily stored in an accumulator register, which is specialized in handling the relatively high processing load.

In the above, the number of steps assigned to each period is changed in response to interruption of other processing, which is performed non-periodically. In addition, a minimum number of steps is assigned to each period. Furthermore, the relatively high processing load is given a priority and is performed in the last period within the plurality of periods irrespective of interruption.

Specifically, a signal processing device includes a storage section for temporarily storing digital data input thereto, a coefficient storage section for storing a plurality of coefficients for use in signal processing, an arithmetic operation section for performing arithmetic operations by use of the digital data read from the storage section and the coefficients read from the coefficient storage section, a primary accumulator register for storing results of the arithmetic operations, a control section for producing instructions for the arithmetic operations, addresses for read/write operations of the digital data, and control signals, and a secondary accumulator register, which is specialized in handling a relatively high processing load having a plurality of steps, wherein the control section distributes plural steps to plural periods in response to output timings, so that intermediate results of arithmetic operations regarding the relatively high processing load are temporarily stored in the secondary accumulator register.

Due to the distribution and appropriate assignment of steps regarding the relatively high processing load to plural periods, it is possible to additionally perform other processing due to interruption. Due to the provision of the secondary accumulator register specialized in handling the relatively high processing load, it is unnecessary to temporarily evacuate intermediate results of arithmetic operations to another memory; hence, it is possible to efficiently use the signal processing device. In addition, the secondary accumulator register automatically stores intermediate result of arithmetic operations. This reduces a considerable number of steps needed for the evacuation of data to another memory during the signal processing.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

Figure 1:
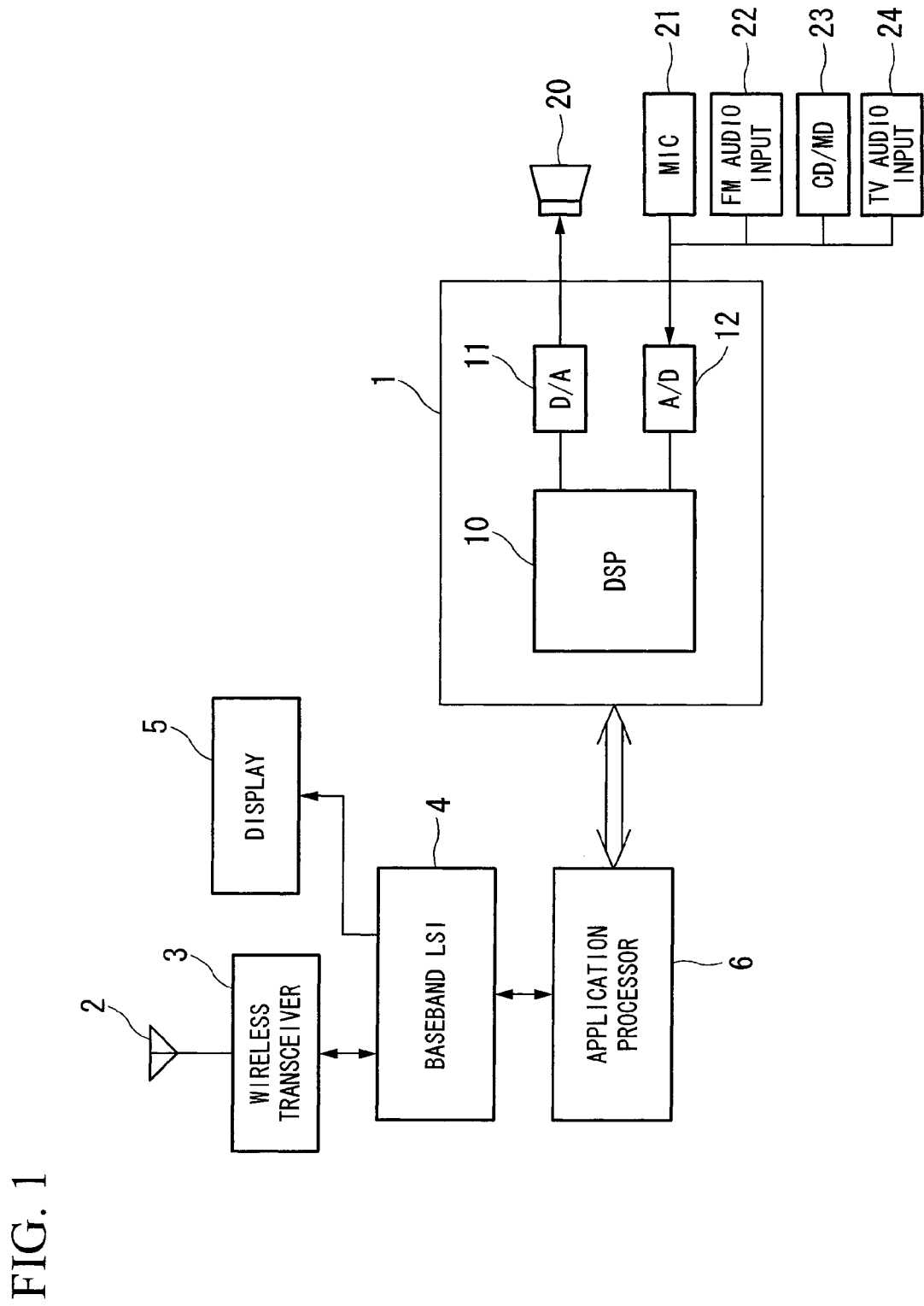
FIG. 1 is a block diagram showing the constitution of a portable telephone having signal processing functions in accordance with a preferred embodiment of the present invention.

FIG. 1 shows the constitution of a portable telephone (or a cellular phone) having signal processing functions in accordance with a preferred embodiment of the present invention. The portable telephone of FIG. 1 includes a signal processor 1, an antenna 2, a wireless transceiver 3, a baseband LSI 4, a display 5, an application program 6, a speaker 20, a microphone 21, an FM audio input unit 22, a CD/MD signal input unit 23, and a TV audio input unit 24.

The signal processor 1 includes a digital signal processor (DSP) 10, a D/A converter 11, and an A/D converter 12. The DSP 10 performs signal processing on digital audio data representing musical tones, speech, and the like, which were subjected to periodical sampling.

The D/A converter 11 converts digital audio signals, which were already subjected to signal processing in the DSP 10, into analog audio signals, which are then supplied to the speaker 20.

The A/D converter 12 converts analog audio signals, which are supplied from the microphone 21, the FM sound input unit 22, the CD/MD signal input unit 23, and the TV sound input unit 24, into digital audio signals, which are then supplied to the DSP 10.

The wireless transceiver 3 is capable of transmitting and receiving wireless signals (or radio signals) representing telephone communications and data communications via the antenna 2. The wireless transceiver 3 is also capable of receiving television signals representing pictures and sounds as well as other audio signals such as FM audio signals.

The baseband LSI 4 decodes high-frequency signals, which are supplied from the wireless transceiver 3, into baseband signals.

The application processor 6 inputs signals, which were subjected to the signal processing in the DSP 10. Specifically, the application processor 6 performs prescribed processing such as three-dimensional processing (or sound source localization), audio effect processing, and delay processing so as to impart audio effects to the input signals, thus producing audio-effect-imparted data, which are then supplied to the DSP 10.

Figure 2:
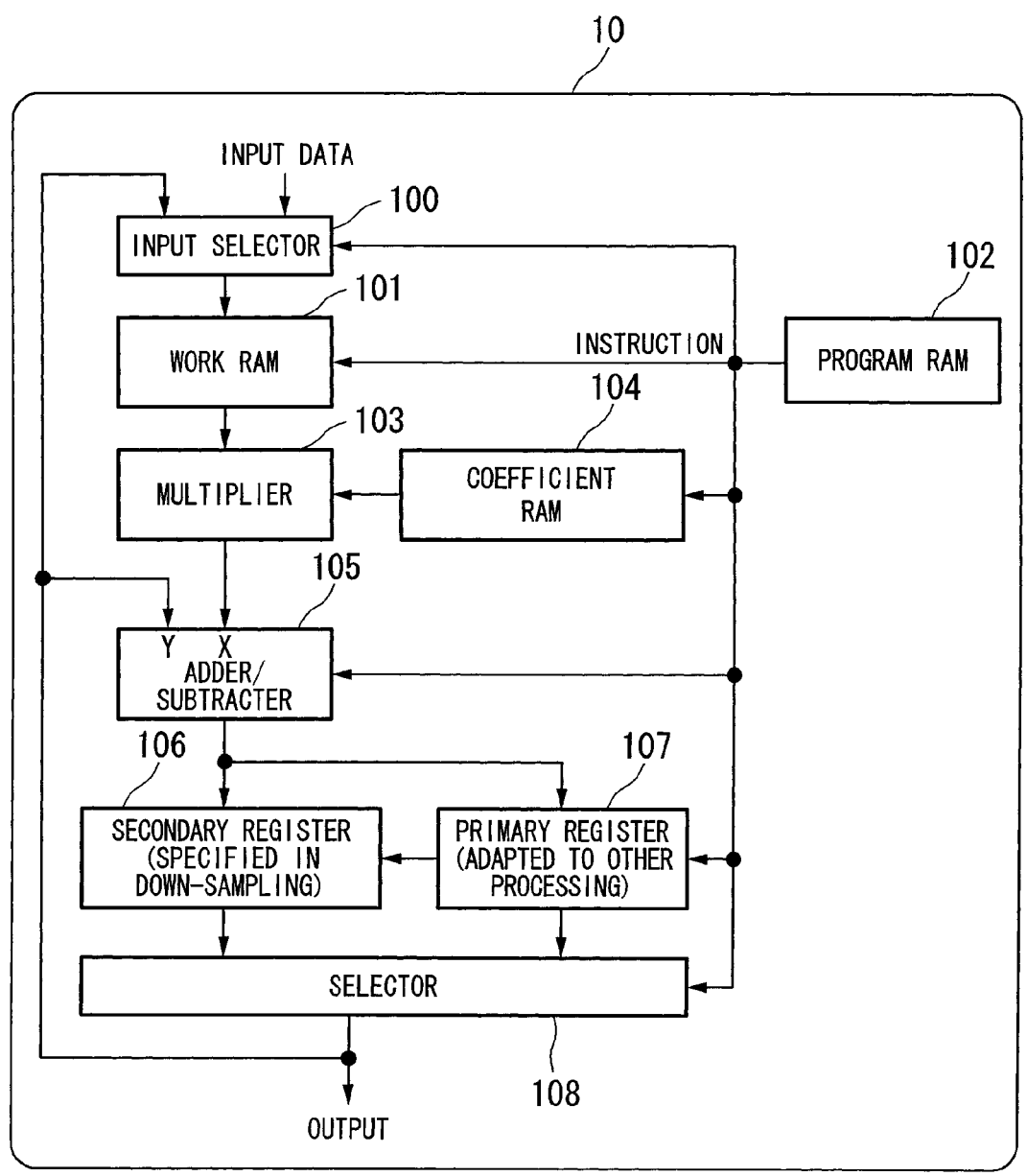
FIG. 2 is a block diagram showing an internal constitution of a digital signal processor included in the portable telephone shown in FIG. 1.

FIG. 2 shows an internal constitution of the DSP 10. The DSP 10 shown in FIG. 2 includes an input selector 100, a work RAM 101, a program RAM 102, a multiplier 103, a coefficient RAM 104, an adder/subtracter 105, a secondary register 106, a primary register 107, and a selector 108.

The work RAM 101 temporarily stores digital data input thereto. The coefficient RAM 104 stores coefficients used for various processing. The multiplier 103 multiplies digital data, which are read from the work RAM 101, and coefficients, which are read from the coefficient RAM 104.

The adder/subtracter 105 performs addition or subtraction on the multiplication result produced by the multiplier 103 and the data output from the primary register 106 or the primary register 107.

The secondary register 106 is a secondary accumulator register for storing intermediate results of the down-sampling, which forms a relatively high processing load. The primary register 107 is a primary accumulator register for storing intermediate results of other processing such as processing periodically executed in units of periods (fs) and processing non-periodically executed due to interruption.

The program RAM 102 outputs various instructions used for operational processing, addresses for read/write operations of data, and control signals.

The program RAM 102 distributes assignment in units of periods in response to output timings with respect to a relatively high processing load having a plurality of steps, wherein it controls the secondary register 106 to store intermediate results regarding the relatively high processing load.

In the claim language, the work RAM 101 corresponds to a storage section for temporarily storing digital audio data input thereto; the program RAM 102 corresponds to a control section; the coefficient RAM 104 corresponds to a coefficient storage section; the multiplier 103 and the adder/subtracter 105 correspond to an arithmetic operation section; the primary register 107 corresponds to the primary accumulator register; and the secondary register 106 corresponds to the secondary accumulator register.

In accordance with instructions output from the program RAM 102, digital audio data are input via the input selector 100 and are then written into an area designated by a prescribed address in the work RAM 101. Then, digital audio data are read from the work RAM 101 and are then supplied to the multiplier 103.

Coefficients used for prescribed processing are read from the coefficient RAM 104 and are then supplied to the multiplier 103. The multiplier 103 multiplies digital audio data read from the work RAM 101 and coefficients read from the coefficient RAM 104 so as to produce multiplication results, which are then supplied to an input terminal X of the adder/subtracter 105. In the initial state, the adder/subtracter 105 does not have values to be added to or subtracted from the multiplication results of the multiplier 103; hence, the multiplication results are written into the secondary register 106 when they are related to a relatively high processing load, or they are written into the primary register when they are related to other processing. The data stored in the secondary register 106 or the primary register 107 is output to an external device (not shown) via the selector 108 and is also returned to an input terminal Y of the adder/subtracter 105.

Next digital audio data are written into the work RAM 101 via the input selector 100. Thereafter, digital audio data are read from the work RAM 101 at the prescribed timing and are then supplied to the multiplier 103.

Correspondingly, coefficients are read from the coefficient RAM 104 and are then supplied to the multiplier 103. The multiplier 103 multiplies digital audio data read from the work RAM 101 and coefficients read from the coefficient RAM 104 so as to produce multiplication results, which are then supplied to the input terminal X of the adder/subtracter 105.

In accordance with instructions output from the program RAM 102, the adder/subtracter 105 performs addition or subtraction on the multiplication results of the multiplier 103 and the data output from the secondary register 106 or the primary register 107, thus producing operational results, which are then written into the secondary register 106 or the primary register 107. The data output from the secondary register 106 or the primary register 107 is output to the external device (not shown) via the selector 108 and is also returned to the input terminal Y of the adder/subtracter 105.

As described above, a series of operations are sequentially performed every time the input selector 100 inputs digital audio data. Thus, the DSP 10 performs various processing such as down-sampling.

Figure 3:
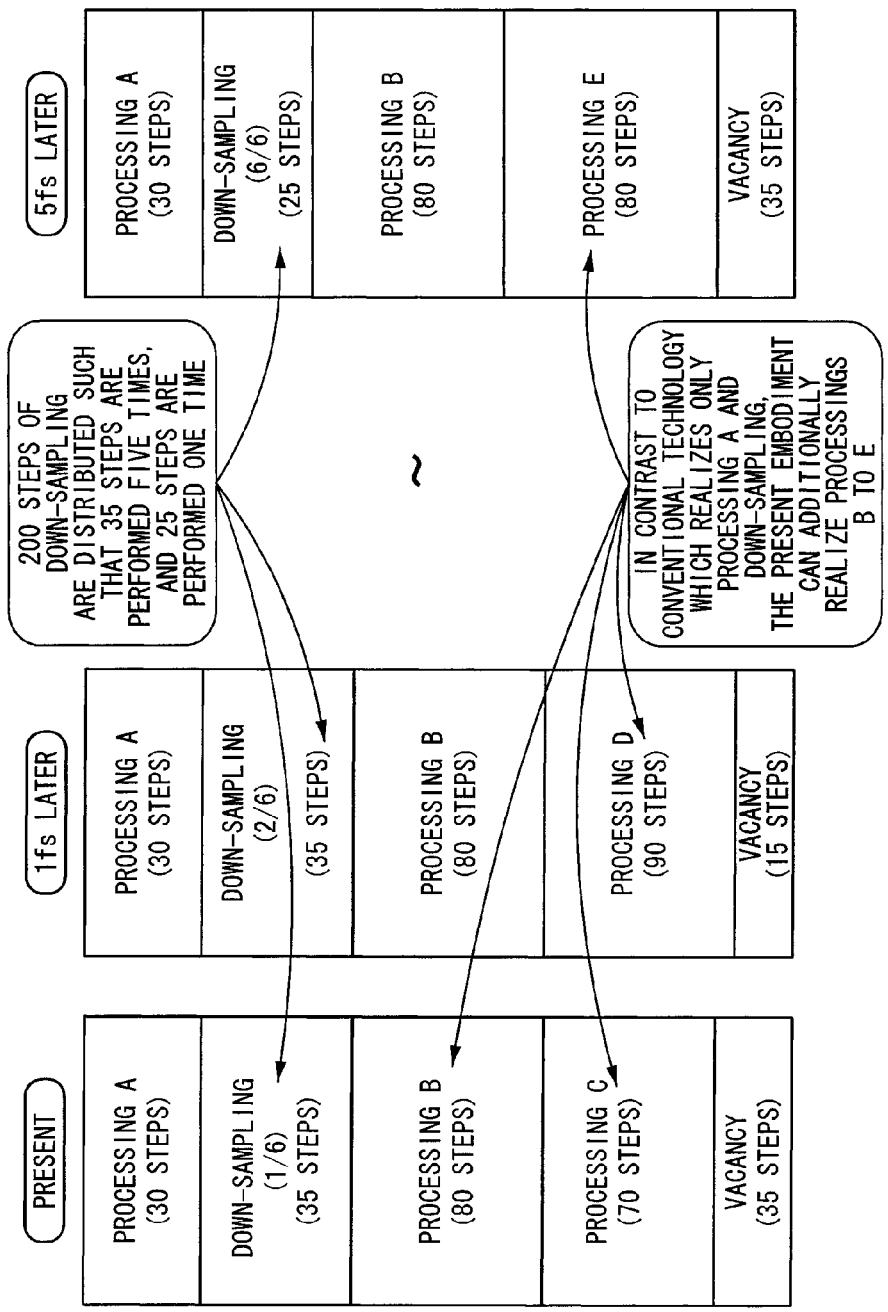
FIG. 3 is a time-related flow chart showing operations of the digital signal processor shown in FIG. 2.
Figure 4:
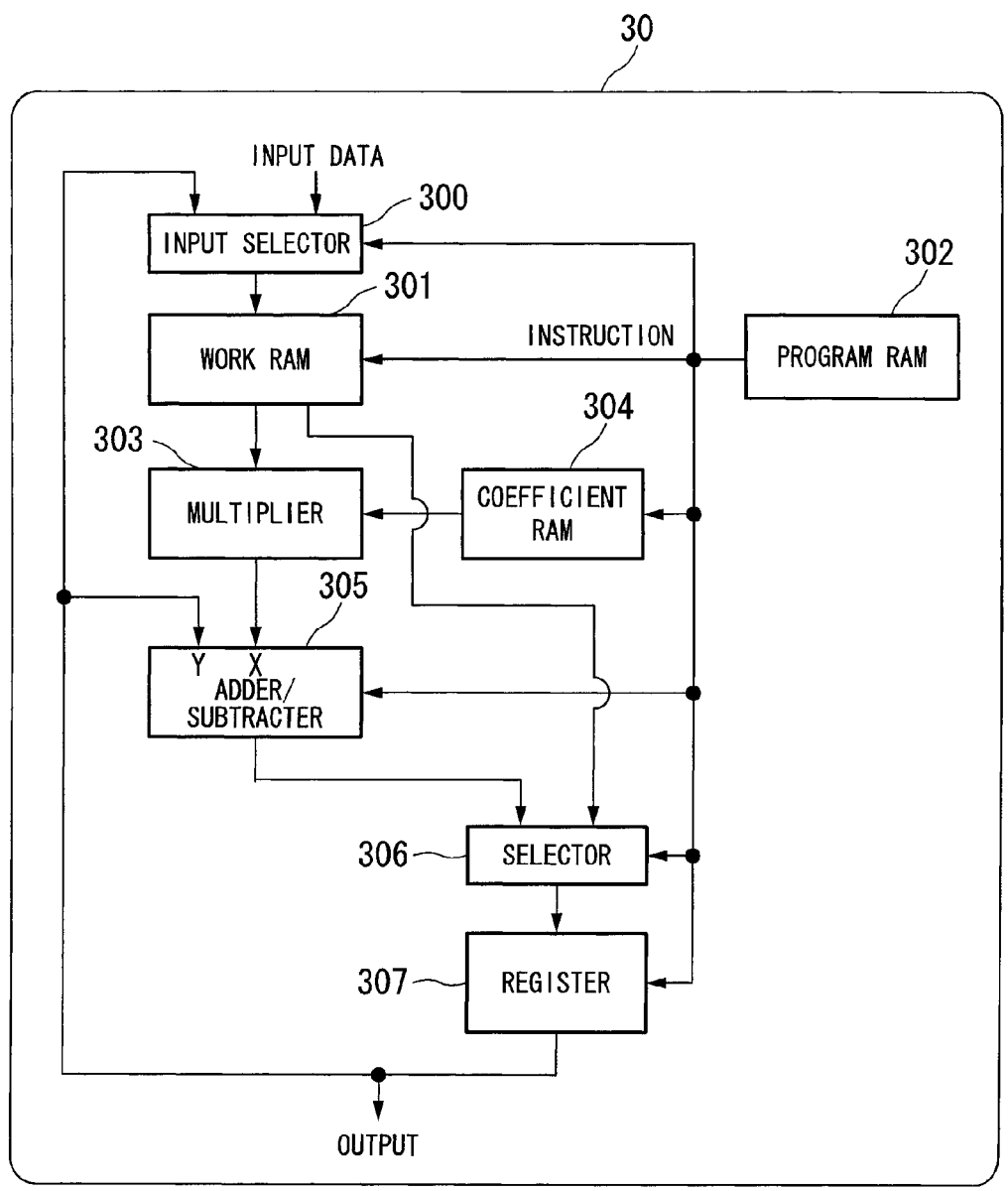
FIG. 4 is a block diagram showing the constitution of a conventionally-known digital signal processor.
Figure 5:
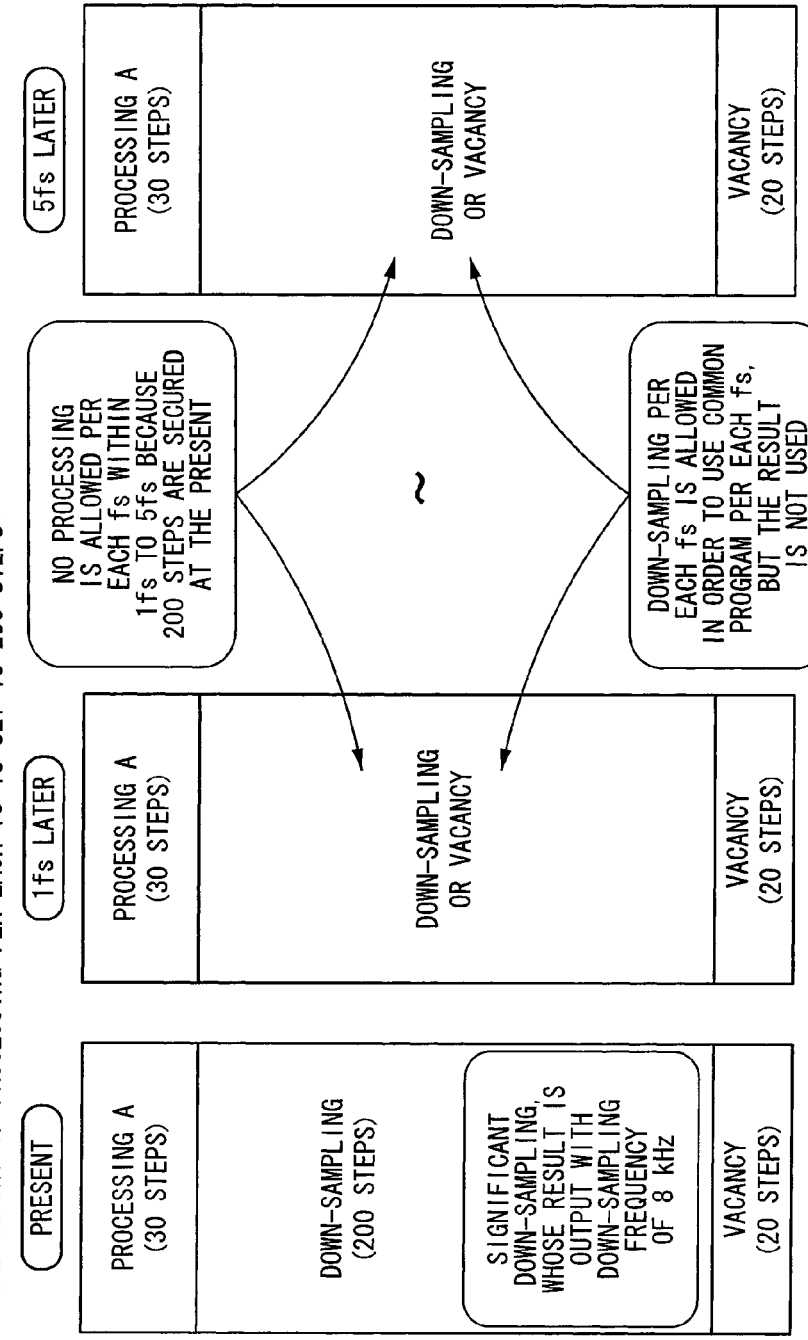
FIG. 5 is a time-related flow chart showing operations of the digital signal processor shown in FIG. 4.

Next, the details of processing executed in the DSP 10 will be described with reference to FIG. 3. Herein, a relatively high processing load is imparted to down-sampling, which needs 200 steps for reducing the sampling frequency from 48 kHz to 8 kHz, for example. In addition, the DSP 10 has a capability of performing 250 steps per each period (fs). In FIG. 3, "processing A" and "processing B" are each periodically executed in units of periods (fs), wherein they correspond to audio-effect processing, whereas "processing C", "processing D", and "processing E" are each executed non-periodically due to interruption, for example.

In the present embodiment, the down-sampling is performed so as to reduce the sampling frequency from 48 kHz to 8 kHz; hence, when the down-sampling realized by 200 steps is uniformly distributed in 6 fs, approximately 33 steps are performed in units of periods (fs). Incidentally, the number of steps performed in each period is not necessarily set to ⅙ of the total number of steps; that is, as shown in FIG. 3, 200 steps are distributed in 6 fs such that 35 steps are adapted to 5 fs, 25 steps are adapted to 1 fs.

As described above, the present embodiment appropriately distributes the down-sampling having a relatively high processing load, which is realized by plural steps, into plural periods (fs). This allows other processing to be additionally executed in units of periods; hence, it is possible to efficiently use the signal processing device.

The present embodiment is characterized by using the secondary register (or secondary accumulator register) 106 specialized in relatively high processing loads such as the down-sampling. In the conventionally-known DSP 30 having a single accumulator register (i.e., the register 307), a plurality of processing loads are performed in a time-division manner such that, every time it completes down-sampling in each period (fs), data stored temporarily in the accumulator register are once evacuated to the memory (i.e., the work RAM 301) and are then returned to the accumulator register when resuming down-sampling. In contrast to the conventionally-known DSP 30, the DSP 10 of the present embodiment does not need evacuation of data because the secondary accumulator register 106 specialized in a relatively high processing load (e.g., down-sampling) is provided. This eliminates a considerable number of steps, which are necessary to realize evacuation of data.

In addition, the present embodiment is characterized in that the down-sampling is not necessarily distributed in a fixed manner; that is, as shown in FIG. 3, the numbers of steps executed in different periods are changed in such a way that the processings A and B are each periodically executed in units of periods, while the other processings C, D, and E are each executed non-periodically due to interruption by appropriately changing the number of steps executed in each period (fs). For example, when the other processing realized by a relatively large number of steps should be completed in a certain period (fs), the number of steps regarding the down-sampling (e.g., 35 steps executed in each period) is reduced or canceled in that period, wherein the reduced or canceled number of steps regarding the down-sampling is performed in the next period, for example.

In the above, the down-sampling should be finished within 6 fs; hence, it may be necessary to secure the minimum number of steps executed in each period (fs); alternatively, the down-sampling is given a priority to complete the processing thereof by the final period irrespective of interruption.

In the case of FIG. 3, a vacancy exists in each period; hence, in order to eliminate the vacancy, it is possible to perform the down-sampling as a first priority.

Incidentally, the present embodiment performs the down-sampling as an example of a relatively high processing load; however, it is not necessarily limited to the down-sampling.

As described above, the present embodiment is illustrative and not restrictive, and it can be further modified in a variety of ways within the scope of the invention as defined in the appended claims.

What is claimed is:

1. A method of performing a signal processing task on digital data, which are produced by way of periodical sampling in units of periods, the method comprising the steps of:
   performing a first arithmetic operation for a processing load other than a relatively high processing load, relating to the signal processing task;
   temporarily storing an intermediate result of the signal processing task from the first arithmetic operation in a first accumulator register;
   distributing the signal processing task requiring a plurality of second arithmetic operations having the relatively high processing load among a plurality of sampling periods;
   performing the plurality of second arithmetic operations during the plurality of sampling periods; and
   temporarily storing an intermediate result of the signal processing task from the second arithmetic operations assigned to each of the plurality of sampling periods in a second accumulator register specialized for the relatively high processing load.

2. The method according to claim 1, wherein a number of the second arithmetic operations assigned to each of the sampling periods is changed in response to interruption of other processing that is performed non-periodically.

3. The method according to claim 1, wherein a minimum number of the second arithmetic operations is assigned to each of the sampling periods.

4. The method according to claim 1, wherein the relatively high processing load is given a priority and is performed in a last period within the plurality of sampling periods regardless of any interruption.

5. The method according to claim 1, wherein the digital data correspond to digital audio data, and the relatively high processing load corresponds to down-sampling for reducing a sampling frequency.

6. A signal processing device for performing a signal processing task on digital data, which are produced by way of periodical sampling, said signal processing device comprising:
   a storage section for temporarily storing the digital data input thereto;
   a coefficient storage section for storing a plurality of coefficients for use in the signal processing;
   an arithmetic operation section for performing arithmetic operations of the digital data read from the storage section and the coefficients read from the coefficient storage section;
   a primary accumulator register for storing results of the arithmetic operations;
   a control section for producing instructions for the arithmetic operations, addresses for read/write operations of the digital data, and control signals; and
   a secondary accumulator register specialized for a relatively high processing load requiring a plurality of arithmetic operations,
   wherein the control section distributes the signal processing task requiring the plurality of arithmetic operations among a plurality of sampling periods, and
   wherein an intermediate result of the signal processing task from the arithmetic operations assigned to each of the plurality of sampling periods for the relatively high processing load is temporarily stored in the secondary accumulator register.

7. The signal processing device according to claim 6, wherein a number of the arithmetic operations assigned to each of the sampling periods is changed in response to interruption of other processing that is performed non-periodically.

8. The signal processing device according to claim 6, wherein a minimum number of the arithmetic operations is assigned to each of the sampling periods.

9. The signal processing device according to claim 6, wherein the relatively high processing load is given a priority and is performed in a last period within the plurality of periods regardless of any interruption.

10. The signal processing device according to claim 6, wherein the digital data correspond to digital audio data, and the relatively high processing load corresponds to down-sampling for reducing a sampling frequency.

11. A method of performing a signal processing task on digital data, which are produced by way of periodical sampling in units of periods, the method comprising the steps of:
    distributing the signal processing task requiring a plurality of arithmetic operations having a relatively high processing load among a plurality of sampling periods;
    performing the plurality of arithmetic operations during the plurality of sampling periods; and
    temporarily storing an intermediate result of the signal processing task from the arithmetic operations assigned to each of the plurality of sampling periods in a second accumulator register specialized for the relatively high processing load,
    wherein a number of the arithmetic operations assigned to each of the sampling periods is changed in response to interruption of other processing that is performed non-periodically.

12. A method of performing a signal processing task on digital data, which are produced by way of periodical sampling in units of periods, the method comprising the steps of:
    distributing the signal processing task requiring a plurality of arithmetic operations having a relatively high processing load among a plurality of sampling periods;
    performing the plurality of arithmetic operations during the plurality of sampling periods; and
    temporarily storing an intermediate result of the signal processing task from the arithmetic operations assigned to each of the plurality of sampling periods in a second accumulator register specialized for the relatively high processing load,
    wherein the relatively high processing load is given a priority and is performed in a last period within the plurality of sampling periods regardless of any interruption.

* * * * *